United States Patent
Koo

(10) Patent No.: US 7,317,299 B2
(45) Date of Patent: Jan. 8, 2008

(54) METHOD OF CALCULATING AGING FACTOR OF BATTERY FOR HYBRID VEHICLE

(75) Inventor: Jae-Seung Koo, Hwaseong-si (KR)

(73) Assignee: Hyundai Motor Company, Seoul (KR)

( * ) Notice: Subject to any disclaimer, the term of this patent is extended or adjusted under 35 U.S.C. 154(b) by 252 days.

(21) Appl. No.: 11/299,386

(22) Filed: Dec. 8, 2005

(65) Prior Publication Data

US 2007/0114972 A1    May 24, 2007

(30) Foreign Application Priority Data

Nov. 18, 2005   (KR) ............... 10-2005-0110941

(51) Int. Cl.
    *H02J 7/00*    (2006.01)
(52) U.S. Cl. ...................... 320/132; 320/104
(58) Field of Classification Search ............. 320/127, 320/131, 132, 104
    See application file for complete search history.

(56) References Cited

U.S. PATENT DOCUMENTS

| | | | | |
|---|---|---|---|---|
| 5,680,050 | A * | 10/1997 | Kawai et al. ............... | 324/427 |
| 6,653,819 | B2 * | 11/2003 | Nagata et al. ............. | 320/133 |
| 6,700,383 | B2 * | 3/2004 | Kimura et al. ............. | 324/429 |
| 6,710,575 | B2 * | 3/2004 | Youn ........................ | 320/104 |
| 6,960,899 | B2 * | 11/2005 | Kobayashi et al. ........ | 320/136 |
| 7,078,878 | B2 * | 7/2006 | Koo .......................... | 320/132 |
| 2001/0035742 | A1 * | 11/2001 | Ito et al. .................... | 320/157 |
| 2004/0119441 | A1 * | 6/2004 | Koo .......................... | 320/104 |
| 2004/0155629 | A1 * | 8/2004 | Kobayashi et al. ........ | 320/127 |
| 2005/0231165 | A1 * | 10/2005 | Melichar .................... | 320/132 |

FOREIGN PATENT DOCUMENTS

| | | |
|---|---|---|
| JP | 2002-243813 | 8/2002 |
| JP | 2003-178811 | 6/2003 |
| JP | 2003-338325 | 11/2003 |
| JP | 2005-037230 | 2/2005 |
| KR | 10-2002-0054175 | 7/2002 |
| KR | 10-2003-0050125 | 6/2003 |

* cited by examiner

*Primary Examiner*—Bao Q. Vu
*Assistant Examiner*—Nguyen Tran
(74) *Attorney, Agent, or Firm*—Morgan Lewis & Bockius LLP

(57) ABSTRACT

Disclosed herein is a method of calculating the aging factor of a battery for a hybrid vehicle. The method includes the steps of detecting a first actual SOC value of the battery during operation of the vehicle; storing the first SOC value; initializing accumulated charge and discharge current amounts; determining whether the accumulated charge current amount is larger than a first predetermined value; determining whether the accumulated discharge current amount is larger than a second predetermined value if a charge current amount has not accumulated over the first predetermined value; detecting a second actual SOC value if a discharge current amount has accumulated over the second predetermined value; storing the second SOC value; calculating a theoretical accumulated current amount using the first and second SOC values; calculating an actual accumulated current amount using the accumulated charge and discharge current amounts; and calculating the aging factor of the battery using the theoretical and actual accumulated current amounts.

7 Claims, 3 Drawing Sheets

METHOD OF CALCULATING AGING FACTOR OF BATTERY FOR HYBRID VEHICLE

CROSS-REFERENCE TO RELATED APPLICATIONS

The present application is based on, and claims priority from, Korean Application Serial Number 10-2005-0110941, filed on Nov. 18, 2005, the disclosure of which is hereby incorporated by reference herein in its entirety.

FIELD OF THE INVENTION

The present invention relates generally to a method of calculating the aging factor of a battery for a hybrid vehicle and, more particularly, to a method of calculating the aging factor of a battery for a hybrid vehicle, which can precisely calculate the aging factor of the battery in consideration of the fact that the extent of aging is different under different operating conditions for respective batteries.

BACKGROUND OF THE INVENTION

Generally, a Battery Management System (BMS) for a hybrid vehicle measures the voltage, current and temperature of a battery and performs a battery information prediction function and a battery control function, which are required for a Hybrid vehicle Control Unit (HCU), in order to apply a high voltage battery to the vehicle.

Conventionally, the calculation of the State Of Charge (SOC) of the battery is performed using the following Equation 1:

$$SOC[n] = SOC[n-1] - \frac{\sum_{n-1}^{n} I}{Ah_{basic} \times Efficiency_n \times AgingFactor_n} \times 100[\%] \quad (1)$$

wherein I is the charge or discharge current of the battery, SOC is the state of charge, Ah_basic is the reference capacity (rated capacity) of the battery, $Efficiency_n$ is the efficiency of the battery depending on temperature, and $AgingFactor_n$ is the aging factor of the battery.

As shown in Equation 1, the SOC[n] of the battery is calculated in consideration of the accumulated charge and discharge current amounts per unit time, the State Of Health (SOH) efficiency, that is, efficiency depending on temperature, the aging factor of the battery, and the initial reference capacity (rated capacity), with reference to a previous SOC [n−1]. However, the aging factor indicates only the lifetime of a consumable battery and actually available capacity, so that it is impossible to precisely know the aging factor during operation after the installation of the battery in the vehicle.

Although, conventionally, an aging factor has been estimated in consideration of the total use time and the total accumulated current amount after the installation of a new battery in a vehicle, the aging factor is uniformly calculated without taking into account the characteristics of the battery, which vary depending on the operating temperature of the battery, the charge and discharge current amounts, and the user's operating conditions, so that there is a problem in that the control of the battery is unreliable.

SUMMARY OF THE INVENTION

Embodiments of the present invention provide a method of calculating the aging factor of a battery for a hybrid vehicle, which detects the actual SOC values of the battery two or more times and then calculates the aging factor using the ratio between a theoretical accumulated current amount and an actual accumulated current amount in order to calculate the precise aging factor of the battery in consideration of the fact that the extent of aging is different under different operating conditions for respective batteries.

The method includes the steps of detecting a first actual SOC value of the battery during operation of the vehicle; storing the first SOC value; initializing accumulated charge and discharge current amounts; determining whether the accumulated charge current amount is larger than a first predetermined value; determining whether the accumulated discharge current amount is larger than a second predetermined value if a charge current amount has not accumulated over the first predetermined value; detecting a second actual SOC value if a discharge current amount has accumulated over the second predetermined value; storing the second SOC value; calculating a theoretical accumulated current amount using the first and second SOC values; calculating an actual accumulated current amount using the accumulated charge and discharge current amounts; and calculating the aging factor of the battery using the theoretical and actual accumulated current amounts.

BRIEF DESCRIPTION OF THE DRAWINGS

For a better understanding of the nature and objects of the present invention, reference should be made to the following detailed description with the accompanying drawings, in which.

DETAILED DESCRIPTION OF THE PREFERRED EMBODIMENTS

A preferred embodiment of the present invention is described with reference to the accompanying drawings.

A method of calculating the aging factor of a battery for a hybrid vehicle according to the present embodiment is described with reference to the flowchart of FIG. 1.

The present embodiment provides a method including the steps of calculating the actual SOC value of the battery; comparing accumulated charge/discharge current amounts with predetermined reference values (first and second preset values); if the battery has been in use longer than a predetermined time, calculating the actual SOC value of the battery again, and calculating the aging factor using a theoretical accumulated current amount, calculated using the two actual SOC values, and an actual accumulated current amount, calculated using the accumulated charge and discharge current amounts. In this case, the calculation of the actual SOC values of the battery and a method of resetting charge and discharge states of the battery are disclosed in inventions (Korean Patent Application Nos. 10-2000-82936 and 10-2001-0080519) previously filed by the present applicant.

Figure 1:
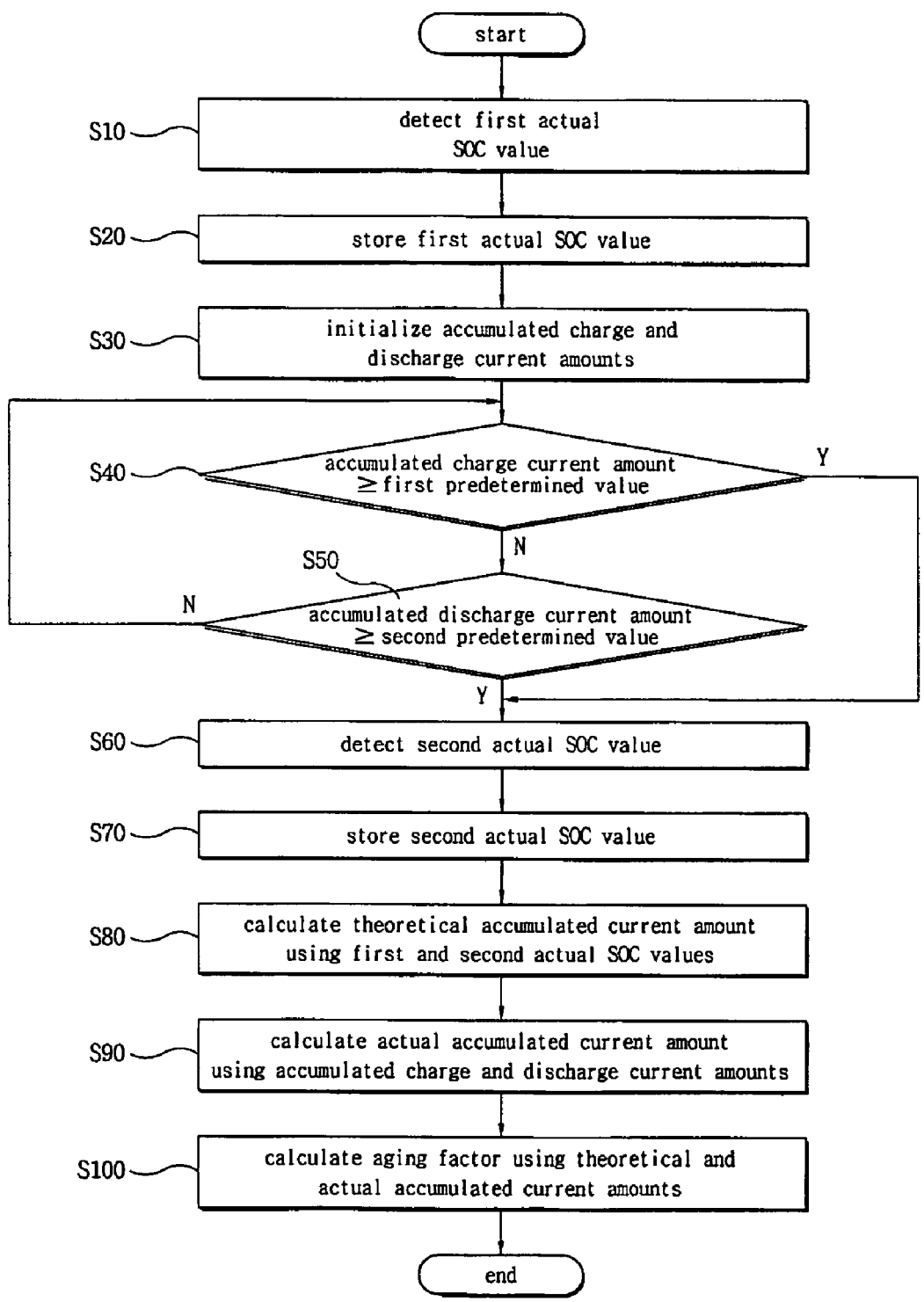
FIG. 1 is a flowchart illustrating a method of calculating the aging factor of a battery according to the present invention.
Figure 2A:
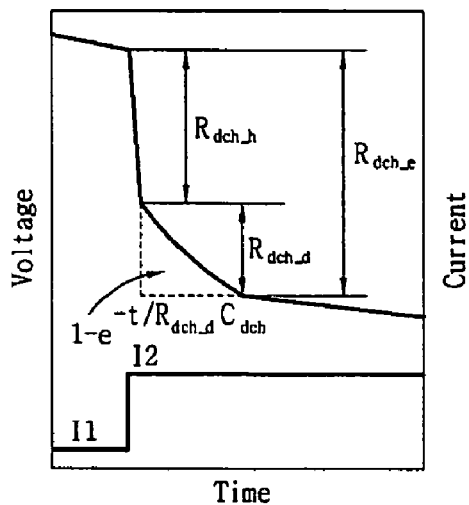
FIG. 2a is a diagram illustrating the characteristic of a battery cell at the time of discharge of the battery.
Figure 2B:
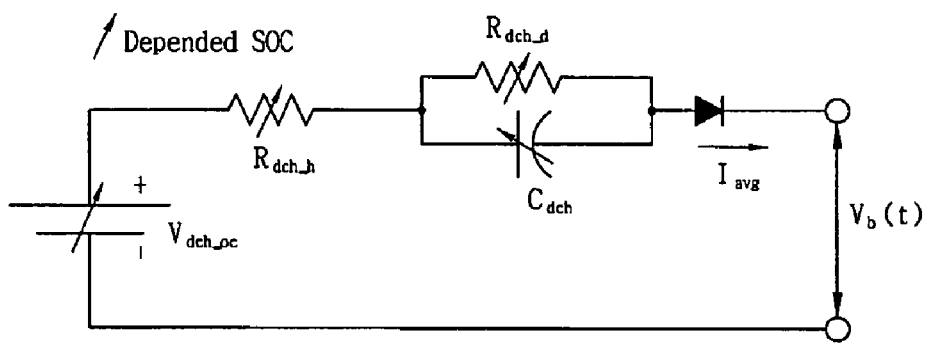
FIGS. 2b and 2c are equivalent circuits of the battery for detection of the SOC values of the battery according to the invention.
Figure 2C:
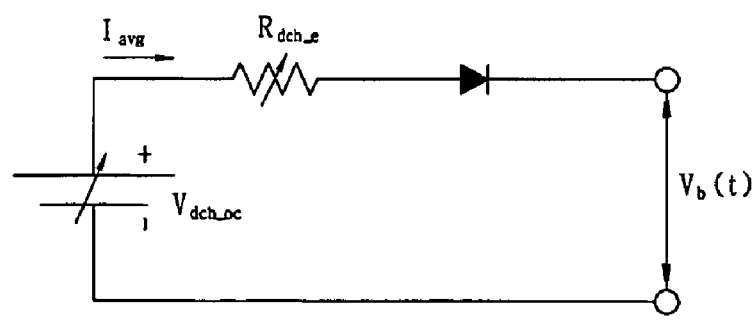

As illustrated in FIG. 1, after the operation of the vehicle, the actual first SOC value is detected and stored at steps S10 and S20. In this case, the actual SOC value is calculated using the current-versus-voltage characteristic. The equivalent circuits of the battery are shown in FIGS. 2b and 2c. FIG. 2a is a diagram illustrating the characteristic of a battery cell at the time of discharge of the battery, FIG. 2b is a diagram illustrating an equivalent circuit, in which discharge capacitance has been taken into account, at the time of discharge of the battery, and FIG. 2c is a diagram illustrating an equivalent circuit in a steady state at the time of discharge of the battery. In FIGS. 2a to 2c, $R_{dch\_e}$ is discharge internal resistance (that is, instant resistance $R_{dch\_n}$+delay resistance $R_{dch\_d}$) in a steady state, and $C_{dch}$ is discharge capacitance.

As illustrated in FIGS. 2a to 2c, in the present embodiment, equivalent charge and discharge voltages are calculated using the equivalent circuit of the battery in a steady state, shown in FIG. 2c (for reference, FIG. 2c shows the equivalent circuit of the battery at the time of discharge). The equivalent discharge voltage is calculated using Equation 2:

$$\text{Equivalent discharge voltage: } V_b(t) = V_{dch\_oc} - (I_{avg} \times R_{dch\_e}) \tag{2}$$

wherein $V_{dch\_oc}$ is the unloaded voltage at the time of discharge, and $R_{dch\_e}$ is the internal resistance at the time of discharge.

Furthermore, although the equivalent circuit of the battery at the time of charging is not illustrated in the drawings, the equivalent charge voltage is calculated using the following Equation 3, as understood from Equation 2.

$$\text{Equivalent charge voltage: } V_b(t) = V_{cha\_oc} + (I_{avg} \times R_{cha\_e}) \tag{3}$$

wherein $V_{cha\_oc}$ is the unloaded voltage at the time of charging, and $R_{cha\_e}$ is the internal resistance at the time of charging.

Figure 3A:
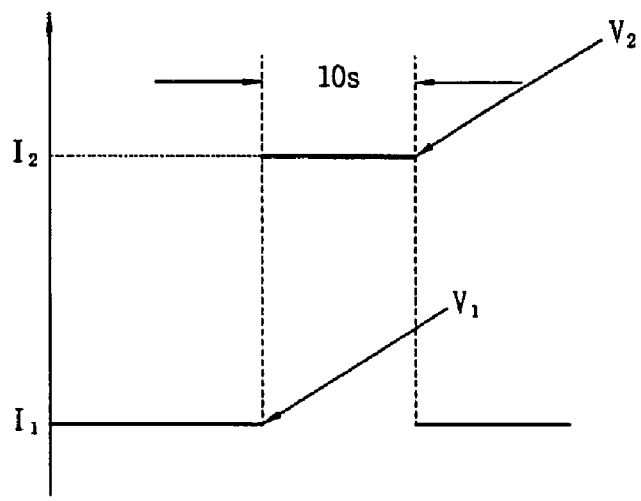
FIG. 3a is a diagram illustrating the detection of the voltage and internal resistance at the time of charging in the equivalent circuit of FIG. 2c according to the present invention.
Figure 3B:
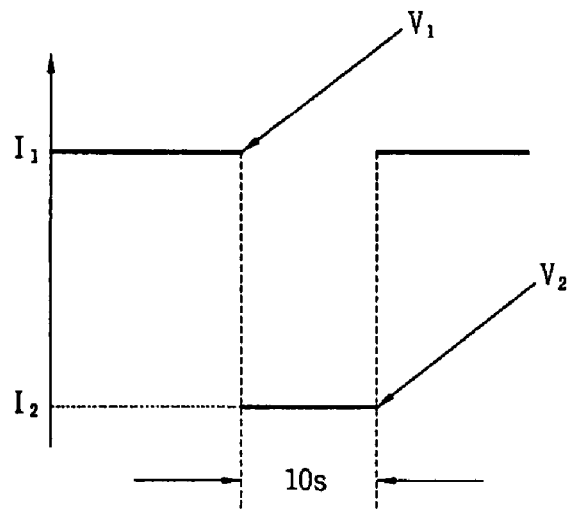
FIG. 3b is a diagram illustrating the detection of the voltage and internal resistance at the time of discharge in the equivalent circuit of FIG. 2c according to the present invention.

In Equation 3, the unloaded charge and discharge voltages in a steady state and the corresponding internal resistances have the relationship illustrated in FIGS. 3a and 3b. FIG. 3a is a diagram illustrating the relationship between the unloaded voltage and the internal resistance, which are detected at the time of charging in the equivalent circuit in a steady state, and FIG. 3b is a diagram illustrating the relationship between the unloaded voltage and the internal resistance, which are detected at the time of discharge in the equivalent circuit in a steady state.

In respective FIGS. 3a and 3b, the SOC of the battery is 10%. The unloaded voltages and internal resistances at the time of charging/discharge are calculated using the following Equations 4 and 5:

$$R_{cha\_e} = (V_2 - V_1)/(I_2 - I_1)[\Omega]$$

$$V_{cha\_oc} = V_2 + (I_2 \times R_{cha\_e})[V] \tag{4}$$

wherein $R_{cha\_e}$ is the internal resistance at the time of charging, and $V_{cha\_oc}$ is the unloaded voltage at the time of charging.

$$R_{dch\_e} = (V_2 - V_1)/(I_2 - I_1)[\Omega]$$

$$V_{dch\_oc} = V_2 - (I_2 \times R_{dha\_e})[V] \tag{5}$$

wherein $R_{dch\_e}$ is the internal resistance at the time of discharge, and $V_{dch\_oc}$ is the unloaded voltage at the time of discharge.

Referring to the flowchart of FIG. 1 again, as illustrated in FIGS. 3a and 3b with reference to the equivalent circuit of FIG. 2c, after the calculation of the first SOC value, accumulated charge and discharge current amounts are initialized to 0 in order to calculate the aging factor at step S30.

After the initialization of the accumulated charge and discharge current amounts at the step S30, whether the accumulated charge current amount exceeds a first predetermined value is determined.

If the charge current amount has not accumulated over the first predetermined value, whether the accumulated discharge current amount exceeds a second predetermined value is determined at step S50.

If the accumulated discharge current amount has not accumulated over the second predetermined value at step S50, the process returns to step S40. However, if the accumulated discharge current amount has accumulated over the second predetermined value at step S50, or if the charge current amount has not accumulated over the first predetermined value at step S40, the accumulated charge and discharge current amounts are initialized and then a second actual SOC value is detected and stored without considering the accumulated discharge current amount at steps S60 and S70. For reference, if the battery is used until the second SOC value has been detected after the detection of the first SOC value, a calculated battery aging factor is reliable. Therefore, it is preferred that the first and second predetermined values be set such that the battery can be used for longer than a predetermined time period after the detection of the first SOC value.

After the detection of the second SOC value at step S60, a theoretical accumulated current amount is calculated using the first and second SOC values at step S80. Then, an actual accumulated current amount is calculated using the accumulated charge and discharge current amounts, used after the detection of the first SOC value, at step S90. The theoretical and actual accumulated current amounts are calculated using the following Equations 6 and 7:

$$\text{Theoretical accumulated current amount} = (\text{first SOC value} - \text{second SOC value}) \times \text{battery reference capacity (Ah\_basic)} \tag{6}$$

$$\text{Actual accumulated current amount} = \text{accumulated charge current amount} - \text{accumulated discharge current amount} \tag{7}$$

As described above, after the calculation of the theoretical and actual accumulated current amounts, the aging factor of the battery is calculated using the calculated amounts at step S100. The aging factor is calculated using the following Equation 8:

$$\text{Aging factor} = \text{actual accumulated current amount} / \text{theoretical accumulated current amount} \tag{8}$$

As described above, in the present invention, in order to precisely calculate the aging factor of a battery, the actual SOC value of the battery is detected two or more times at some interval and then the aging factor is calculated using a theoretical accumulated current amount, calculated using the detected SOC values, and an actual accumulated current amount, calculated using accumulated charge and discharge current amounts acquired until the second SOC value is detected after the detection of the first SOC value, so that the aging factor can be calculated in consideration of the characteristics of the battery during operation.

According to the method of calculating the battery aging factor of a hybrid vehicle of the present invention, the precise aging factor of a battery can be calculated depending on variation in the characteristics of the battery in different environments after the installation of the battery in a vehicle, so that it has the advantage of preventing a decrease in the lifetime of the battery.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of calculating an aging factor of a battery for a hybrid vehicle, comprising the steps of:
    detecting a first actual SOC value of the battery during operation of the vehicle;
    storing the first SOC value;
    initializing accumulated charge and discharge current amounts;
    determining whether the accumulated charge current amount is larger than a first predetermined value;
    determining whether the accumulated discharge current amount is larger than a second predetermined value if a charge current amount has not accumulated over the first predetermined value;
    detecting a second actual SOC value if a discharge current amount has accumulated over the second predetermined value;
    storing the second SOC value;
    calculating a theoretical accumulated current amount using the first and second SOC values;
    calculating an actual accumulated current amount using the accumulated charge and discharge current amounts; and
    calculating the aging factor of the battery using the theoretical and actual accumulated current amounts.

2. The method as defined in claim 1, wherein the step of detecting the second actual SOC value is performed regardless of the accumulated discharge current amount if the accumulated charge current amount is larger than the first predetermined value.

3. The method as defined in claim 1, further comprising the step of returning to the step of determining whether the accumulated charge current amount is larger than a first predetermined value if the accumulated discharge current amount is smaller than the second predetermined value.

4. The method as defined in claim 1, wherein the first and second predetermined values for the accumulated charge and discharge current amounts are set after the first SOC value has been detected and the battery has been used for longer than a predetermined time.

5. The method as defined in claim 1, wherein the theoretical accumulated current amount is calculated using the following Equation:

Theoretical accumulated current amount=(first SOC value−second SOC value)×battery reference capacity.

6. The method as defined in claim 1, wherein the actual accumulated current amount is calculated using the following Equation:

Actual accumulated current amount=accumulated charge current amount−accumulated discharge current amount.

7. The method as defined in claim 1, wherein the aging factor of the battery is calculated using the following Equation:

Aging factor=actual accumulated current amount/ theoretical accumulated current amount.

* * * * *